(12) United States Patent
Liu et al.

(10) Patent No.: US 7,244,653 B2
(45) Date of Patent: Jul. 17, 2007

(54) METHOD AND STRUCTURE IN THE MANUFACTURE OF MASK READ ONLY MEMORY

(75) Inventors: Lawrence Liu, Taipei (TW); Yuan Kao, Hsin-Chu (TW)

(73) Assignee: United Microelectronics Corporation, Hsin-Chu (TW)

( * ) Notice: Subject to any disclaimer, the term of this patent is extended or adjusted under 35 U.S.C. 154(b) by 259 days.

(21) Appl. No.: 10/807,795

(22) Filed: Mar. 23, 2004

(65) Prior Publication Data

US 2005/0224892 A1    Oct. 13, 2005

(51) Int. Cl.
*H01L 27/76* (2006.01)
(52) U.S. Cl. ...................... 438/278; 257/390
(58) Field of Classification Search ............. None
See application file for complete search history.

(56) References Cited

U.S. PATENT DOCUMENTS 6,146,950 A * 11/2000 Sheu et al. ............. 438/275
6,383,910 B2 * 5/2002 Okada et al. ............ 438/622

\* cited by examiner

*Primary Examiner*—Leonardo Andujar
(74) *Attorney, Agent, or Firm*—Squire, Sanders & Dempsey LLP

(57) ABSTRACT

A method and structure of manufacture of mask ROM device is provided. Firstly, a semiconductor structure is provided that comprises a first dielectric layer, a plurality of buried bit lines and a plurality of code areas, wherein each of the code areas is placed between two buried bit lines. Next, a second dielectric layer having a plurality of contact plugs is formed on the semiconductor structure, wherein the contact plug comprises a second dielectric layer and a first glue layer, furthermore; the first glue layer is placed on the side-wall and bottom of the contact plugs. In addition, the contact plugs filled with the first metal layer. Then, a second glue layer, a second metal layer and a pad layer having an opening pattern are respectively formed on the second dielectric layer and contact plug. Thus, the processes of the present invention can improve the stability and accuracy in the electricity of the mask ROM device.

16 Claims, 7 Drawing Sheets

METHOD AND STRUCTURE IN THE MANUFACTURE OF MASK READ ONLY MEMORY

BACKGROUND OF THE INVENTION

1. Field of the Invention

This invention relates to a method and structure in the manufacture of semiconductor memory devices, and more particularly to method and structure of manufacture of mask ROM memory devices.

2. Description of the Prior Art

A memory device is widely used in the information industry, and is particularly used in microprocessors and computers. In order to achieve a faster speed of information exchange with a tremendous quantity, the information product needs the properties that are necessarily small in size and a reduced weight. Besides, the program and operation performed the software has become complicated in the recent years so that the properties are necessarily manufacturing a memory with a higher memory capacity and faster access speed. Therefore, a mask ROM with higher memory capacity, higher integrity and faster access speed is currently a common memory structure.

However, when the dimension of the mask ROM device goes below 0.35 microns or smaller, a gap between 0 to 1 has become smaller in the electricity because of the device margin and narrower line width. Hence, the demanded process window is also getting smaller. When the process with the bigger dimension of the device is completely imitated to a smaller dimension, it could not get a preferred yield due to different properties and different structure with Inter-Layer Dielectric (ILD) between two products.

FIG. 1A to FIG. 1D is the method and structure of manufacture in conventional mask ROM memory devices 100. Referring to FIG. 1A, providing a semiconductor substrate 101 firstly, such as P type silicon substrate, wherein the semiconductor substrate 101 comprises a plurality of buried N+ bit lines 103 therein. Next, a gate oxide layer 105 and a plurality of polysilicon word lines 107 are respectively formed on the semiconductor substrate 101. Then, an inter layer dielectric 109, the material could be Borophosphosilicate Glass (BPSG), is formed on the polysilicon word lines 107. After that, forming a glue layer 111 on the inter layer dielectric 109.

Following that, referring to FIG. 1B, forming a photoresist layer 113 on the glue layer 111, and performing a photolithography and etching process to the photoresist layer 113 in order to form a first opening 112 therein. The photoresist layer 113 having a first opening 112 is formed on the surface of the glue layer 111.

Subsequently, referring to FIG. 1C, utilizing the photoresist layer 113 having a first opening 112 as a photomask and then performing a dry etching process in the glue layer 111. Therefore, the second opening 115 are formed on the surface of the inter layer dielectric (ILD) 109 and within the glue layer 111. Next, removing the photoresist layer 113. Then, performing a step of ion implantation 117 in the mask ROM device 100 so as to form the code areas 119 within the semiconductor substrate 101.

Continue referring to FIG. 1C, as a result it has to etch the glue layer 111 before forming the code areas 119 in the mask ROM device 100, though the inter layer dielectric 109 which is an oxide layer below the glue layer 111. Hence, etching the glue layer 111 will have a phenomenon of over etching within the inter layer dielectric 109, which could not precisely control the thickness of the inter layer dielectric 109 after each etching. Moreover, the etching process will also produce a profile with bevels in the inter layer dielectric 109. For that reason; the phenomenon of over etching and the profile with bevels in the inter layer dielectric 109 will influence the implanted profile and implanted depth of the code areas 119 in the semiconductor substrate 101 when ion implanting in the mask ROM device 100. Also, the threshold voltage of the mask ROM device 100 is decided by the implanted ion concentration so that the profile with bevels and the phenomenon of over etching will cause the implanted ion distribute non-uniformly. Therefore, it causes the electricity unstably in the mask ROM device 100; moreover, the yield will also be influenced.

In addition, due to the fact that the etching process to the mask ROM device 100 is performed first, and then the implantation of ROM code, which decides the order-form from the users. However, the second opening 115 is accessible to oxidize so as to form an oxide layer on the surface while waiting for an order-form. (Because the bottom of the second opening 115 is an inter layer dielectric 109) Therefore, after receiving the order-form from users, it has to perform an etching or cleaning process to the second opening 115 so as to remove the oxide layer, which is formed already. Then, performing the ion implantation following that, so the manufacturing time and manufacturing cost will be improved.

Still, after accomplishing the etching process to the glue layer 111, the second opening 115 produced therein has a negative bias with a critical dimension. Thus, in order to maintain the critical dimensional after the etch inspection as the same as the photomasks critical dimensional after etching the glue layer 111(it means to broaden the code areas 119), the post exposure process of the photoresist layer 113 has to be preformed when doing the photolithography process. However, the patterned photoresist layer and the non-patterned photoresist layer are exited simultaneously on the photoresist layer 113 (the patterned photoresist layer with respects to the implant region, the non-patterned photoresist layer with respects to the non-implant region). Therefore, the process window of the photoresist layer, which is above the non-implant region will be influenced and reduced, even vanished during the post exposure process. This situation will make the device 10 inaccurate with electricity.

Finally, referring to FIG. 1D, utilizing a sputtering method to form a blanket layer of metal 121, which uses as an electric connection with the polysilicon word lines 107, on the mask ROM device 100 and down to the code areas 119.

As mentioned above the process of the conventional mask ROM, the conventional mask ROM device has problems with inaccuracy and unstability in the electricity because etching the glue layer and post exposing to the photoresist layer. Hence, a method of manufacture of mask ROM memory devices is required to overcome the problems of the process in the prior art.

SUMMARY OF THE INVENTION

It is an objective of the present invention to provide a method and structure in the manufacture of a mask ROM (read only memory) device that utilizes a step of blanket etching back to the first glue layer so that the phenomenon of over etching is not produced in the second dielectric layer. It means that the profile of the implanted depth will not be influenced by over etching. Hence, the stability of the device will be enhanced and have a good yield.

It is another objective of the present invention to provide a method and structure in the manufacture of a mask ROM device that directly defines the critical dimension of the second opening on the photoresist layer that the post exposing process is not necessary to perform. Therefore, the accuracy of the device is improved.

It is a further objective of the present invention to provide a method and structure in the manufacture of a mask ROM device that deposits a first metal layer on a first glue layer. However, the steps of planarizing the first metal layer and forming the code areas in the mask ROM device wait until receiving the order-form from a user so that the second dielectric is not oxidized while waiting on an order-form. Hence, the manufacturing time and manufacturing cost will be reduced.

According to a preferred embodiment of the present invention, a method and structure of manufacture of mask ROM device is provided. Firstly, a semiconductor structure comprises a first dielectric layer thereon, a plurality of buried bit lines and a plurality of code areas, wherein each of the plurality of code areas are placed between two of plurality of the buried bit lines therein. Next, a second dielectric layer having a plurality of contact plugs is formed on the semiconductor structure. Furthermore; the first glue layer is placed on the side-wall and bottom of the contact plug. In addition, the contact plug filled with the first metal layer. Then, a second glue layer, a second metal layer and a pad layer with an opening pattern are sequentially formed on the second dielectric layer and contact plug.

BRIEF DESCRIPTION OF THE DRAWINGS

The objectives and features of the present inventions as well as advantages thereof will become apparent from the following detailed description, considered in conjunction with the accompanying drawings. It is to be understood, however, that the drawings, which are not to scale, are designed for the purpose of illustration and not as a definition of the limits of the invention, for which reference should be made to the appended claims.

The present invention can be the best understood through the following description and accompanying drawings, wherein:

FIG. 2I is a top view of a mask ROM device, schematically illustrating a layout according to a preferred embodiment of the present invention.

DESCRIPTION OF THE PREFERRED EMBODIMENT

Figure 1A:
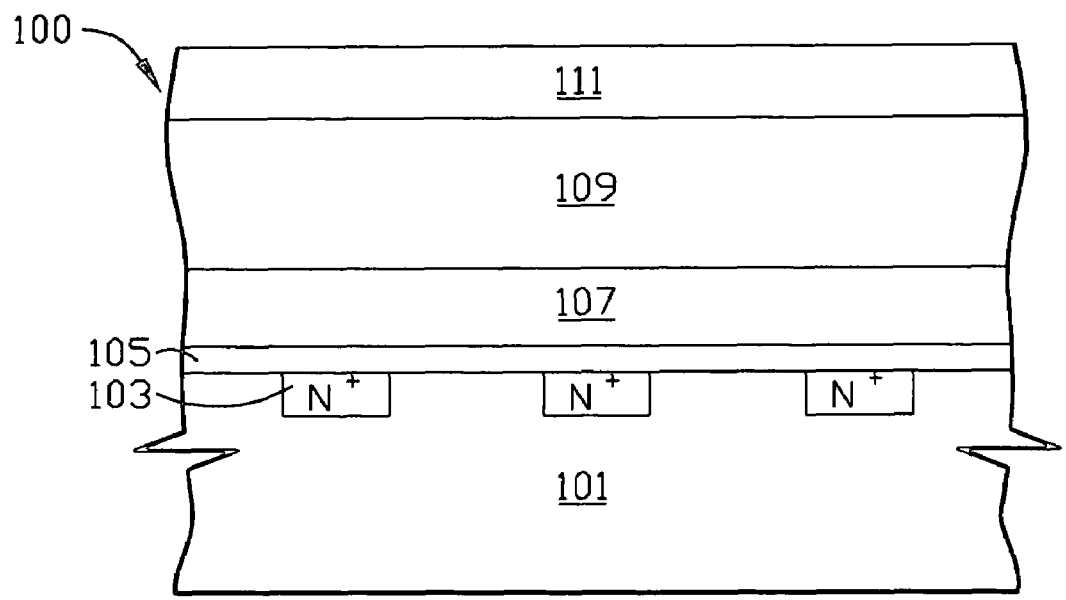
FIG. 1A to 1D shows a schematically cross-sectional views of the various steps of a conventional method and structure in the manufacture of a mask ROM process.
Figure 1B:
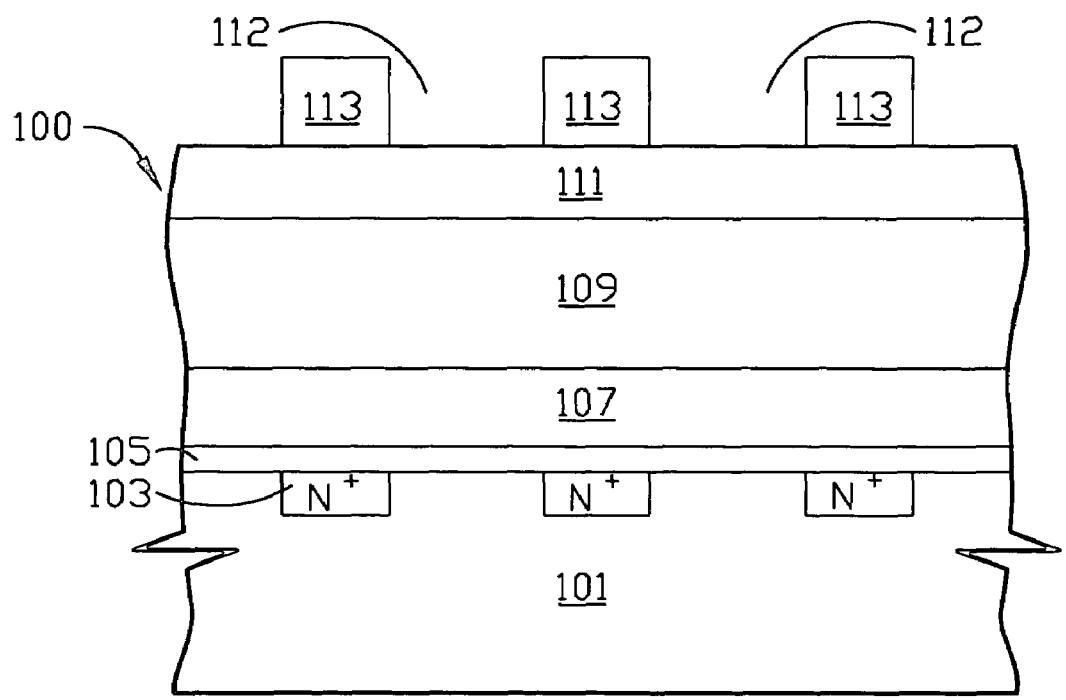
Figure 1C:
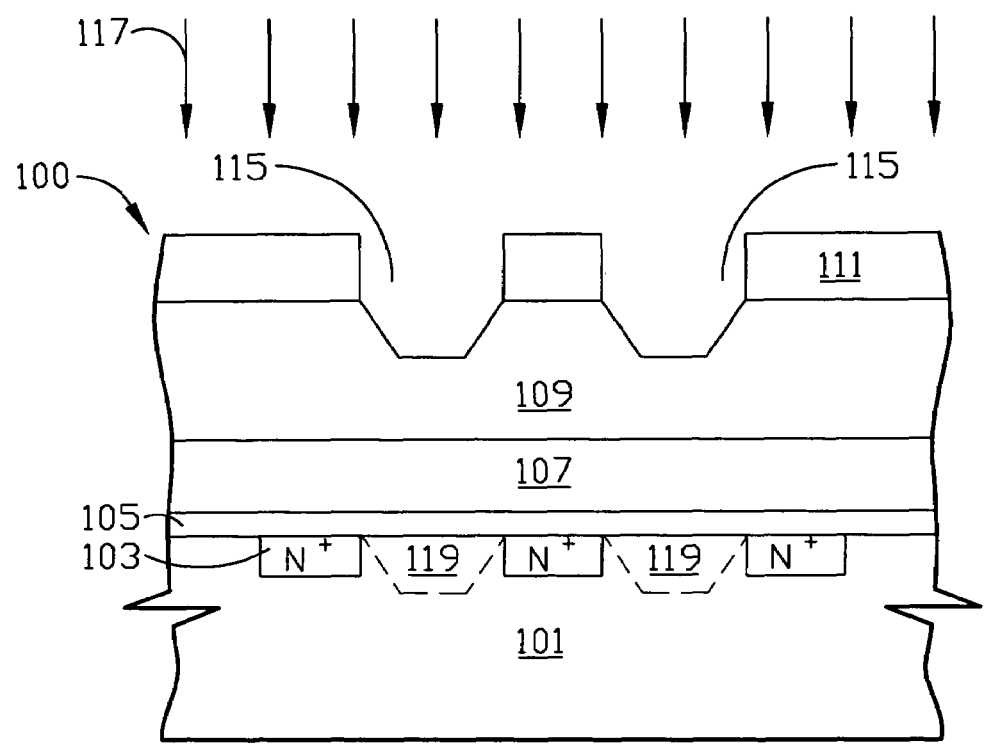
Figure 1D:
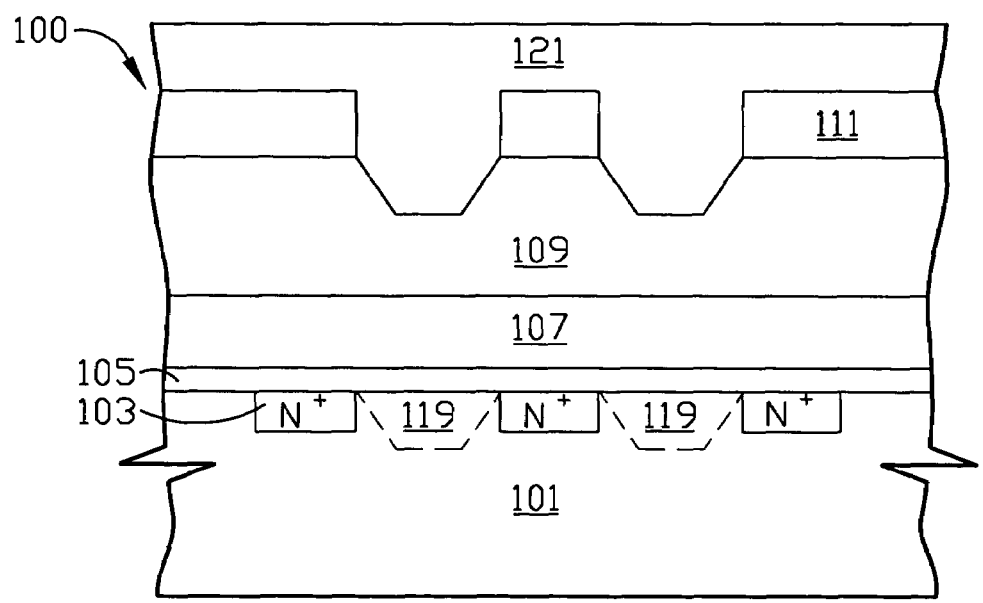
Figure 2A:
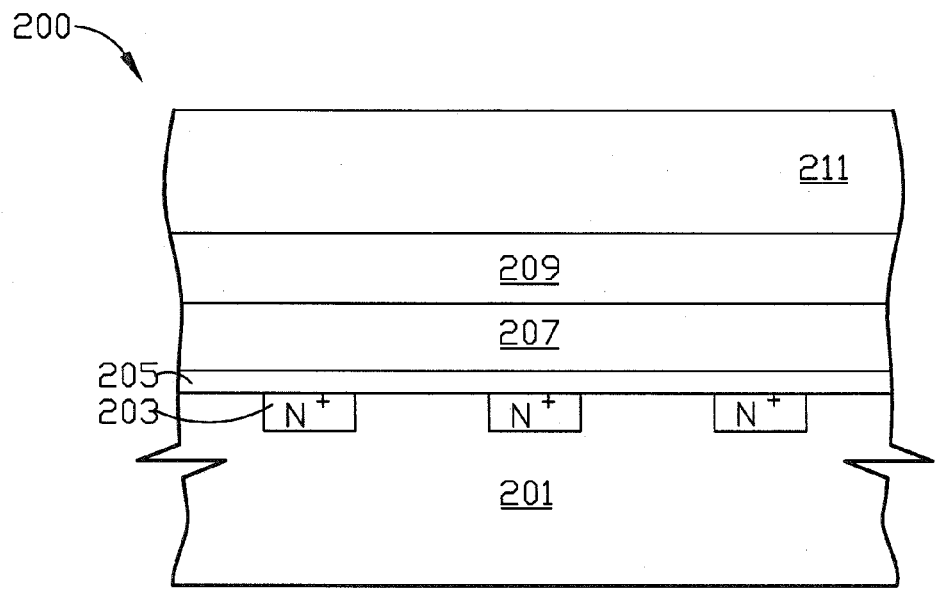
FIG. 2A to 2H shows a schematically cross-sectional view of the various steps of the present invention that a method and structure in the manufacture of a mask ROM according to a preferred embodiment of the present invention.

FIG. 2A to FIG. 2H shows the process flow in accordance with a preferred embodiment of this invention for producing a mask ROM device 200. Referring to FIG. 2A, a semiconductor structure is provided firstly. The semiconductor structure comprises a silicon substrate 201, such as a P type silicon substrate, a gate oxide layer 205 is on the silicon substrate 201, a polysilicon word lines 207 is on the gate oxide layer 205, a first dielectric layer 209 is on the polysilicon word lines 207 and a second dielectric layer 211 with a thickness about 3000–10000 Å(angstroms), which is preferably about 5000 Å, on the first dielectric layer 209. The second dielectric layer 211 is utilized as insulation between the semiconductor device structures, and the material could be Borophosphosilicate Glass (BPSG). Besides, the silicon substrate 201 comprises a plurality of buried bit lines 203 therein, wherein the polysilicon word lines 207 orthogonally oriented with respect to the buried bit lines 203. The polysilicon word lines 207 extending transversely from left to right across the mask ROM device 200.

Figure 2B:
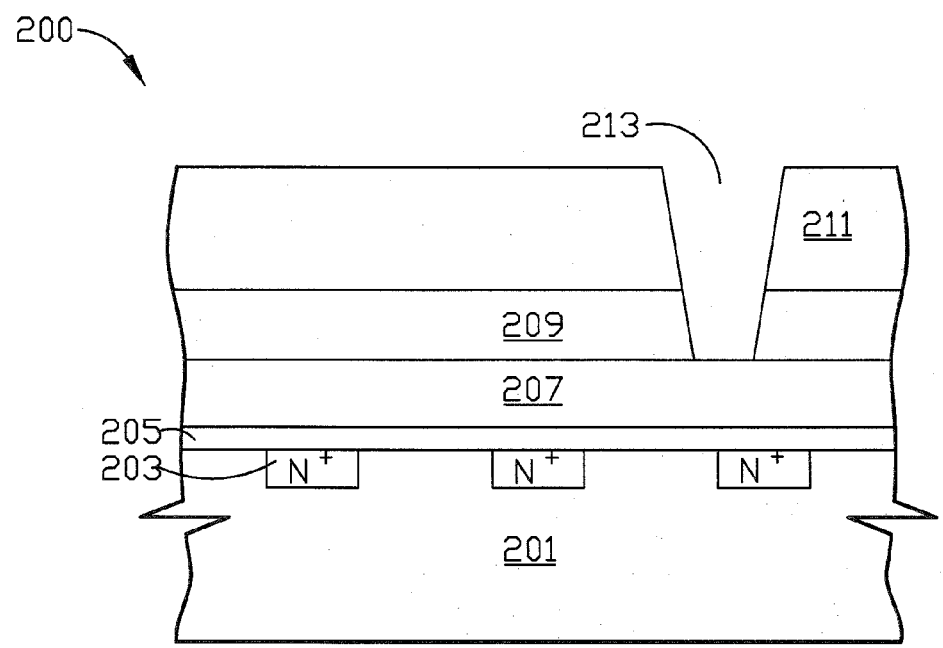
Figure 2C:
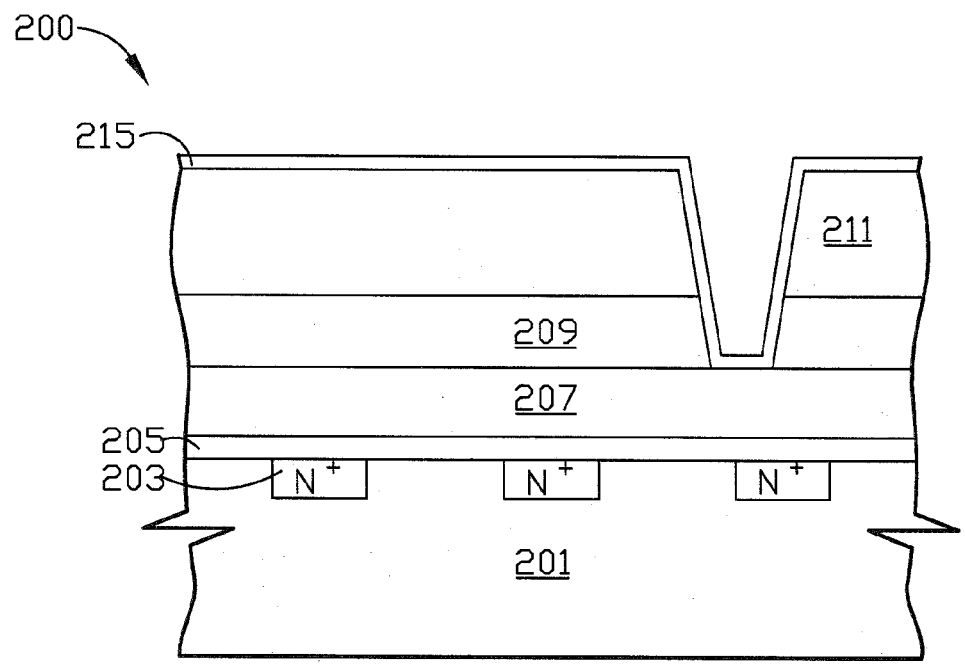

Following that, referring to FIG. 2B, a photoresist layer (not shown in the figure) having open pattern formed on a surface of the second dielectric layer 211. Performing a photolithography and etching process to the photoresist layer in order to form the first opening 213 in the second dielectric layer 211 and the first dielectric layer 209, and exposing a portion of the surface of the the polysilicon word lines 207. Then, forming an interim blanket titanium layer on the second dielectric layer 211, a side-wall and bottom of the first opening 213. Next, performing a rapid thermal annealing (RTA) process to convert the interim titanium layer to the first glue layer 215, for instance titanium/titanium nitride that utilizes to improve the adhesion with other metal layers, as shown in FIG. 2C.

Figure 2D:
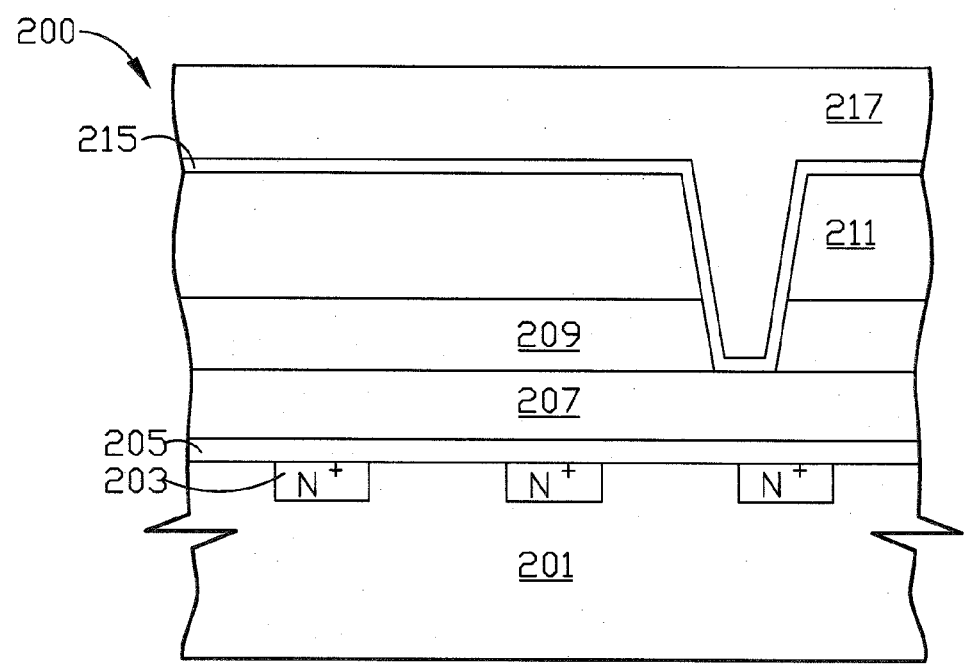
Figure 2E:
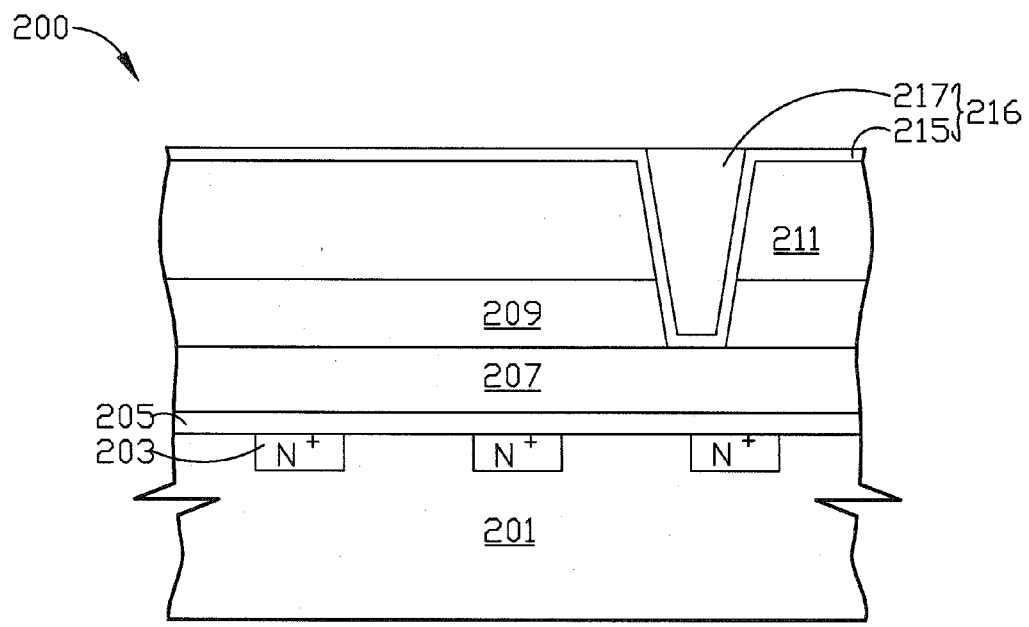

Subsequently, as shown in FIG. 2D, a first metal layer 217 is deposited on the surface of the first glue layer 215, for instance blanket tungsten that filled the first opening 213 and covered the surface of the first glue layer 215. Next, planarizing the first metal layer 217, for instance utilizing a method of chemical mechanical polishing or dry etching with conditions that have a higher ratio to tungsten and use the first glue layer 215 as an etch end point. Therefore, the surface of the first glue layer 215 and first opening 213, which is filled with the first metal layer 217, both are exposed. Then, a contact plug 216 is formed within the second dielectric layer 211 and the first dielectric layer 209, as shown in FIG. 2E.

Figure 2F:
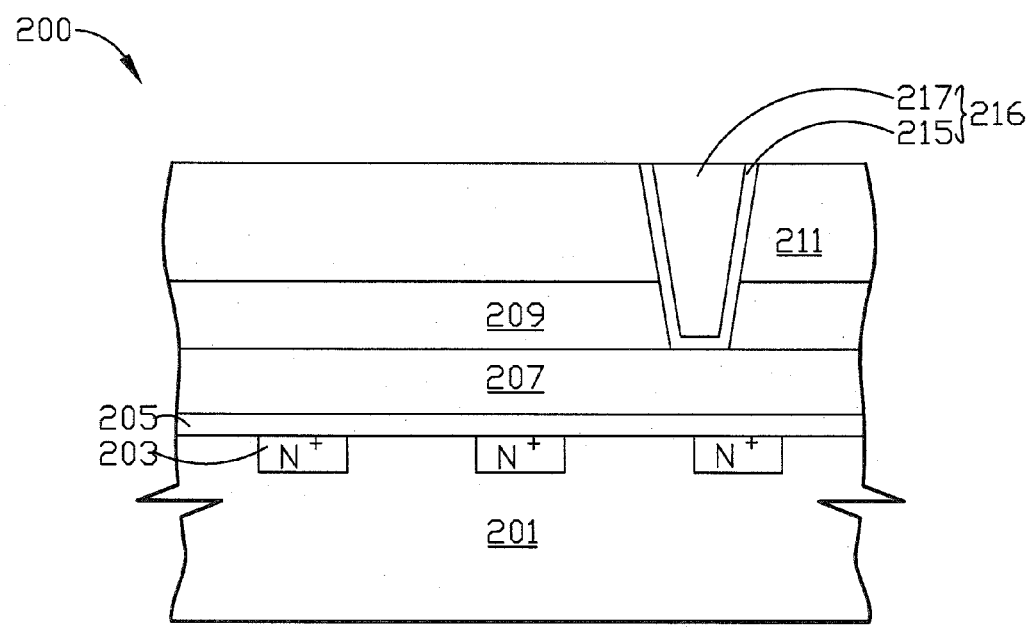

Thereupon, referring to FIG. 2F, after planarizing the first metal layer 217, utilizing a method of chemical mechanical polishing or dry etching, for instance plasma etching or reactive ion etching to perform a blanket etching back to the first glue layer 215, which is outside the contact plug 216. Hence, the surface of the second dielectric layer 211 is exposed. As a result, the blanket etching back process is executed to the first glue layer 215, the first glue layer 215 and a portion of the second dielectric layer 211 below the first glue layer 215 will both be removed. Therefore, the phenomenon of the over etching in the second dielectric layer 211 can be avoided when the first glue layer 215 is removed by dry etching.

Figure 2G:
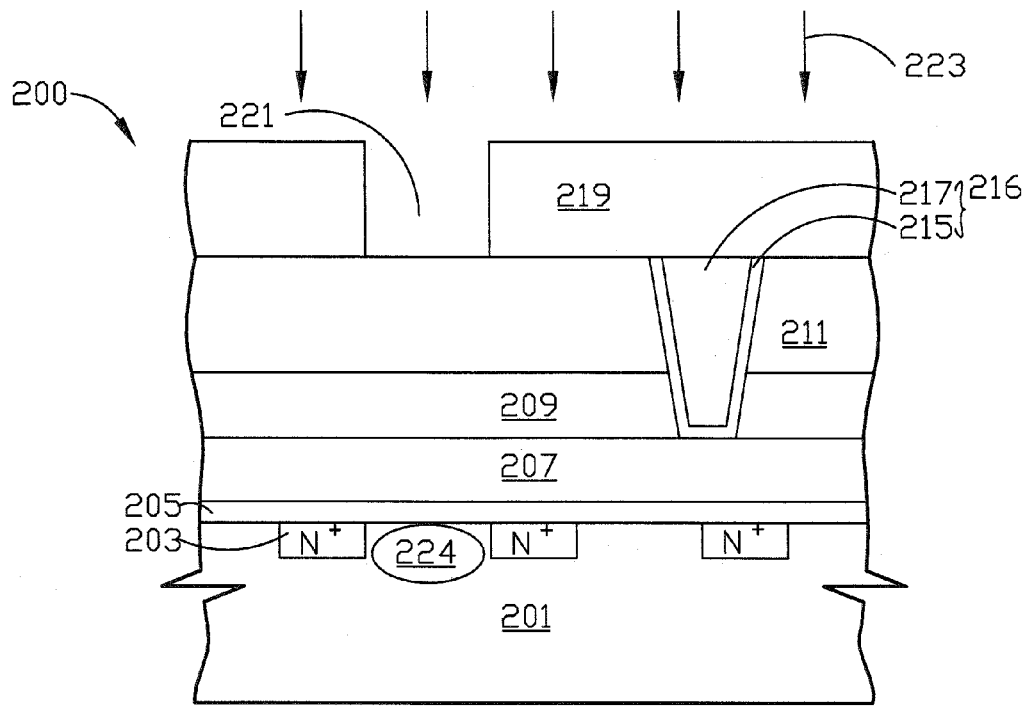

Next, referring to FIG. 2G, a patterned photoresist layer 219 is formed both on the surface of the second dielectric layer 211 and contact plug 216. Etching the photoresist layer 219 in order to form the second opening 221 within the photoresist layer 219 and expose a portion of the second dielectric layer 211. In accordance with the position of the plurality of the buried bit lines 203, the second opening 221 is placed between two of the plurality of buried bit lines 203 and far away from the contact plug 216. After that, utilizing the photoresist layer 219 having the second opening 221 used as a mask to perform a ion implantation process 223 in the mask ROM device 200. The boron ions are implanted into the silicon substrate 201 through the second opening 221 within the photoresist layer 219 in order to form a plurality of code areas 224 in the silicon substrate 201, and between the two of the plurality of buried bit lines 203. The range of the implanted energy is about 200–1000 keV, preferably is about 300 keV.

It is noted that the processes for encoding the ROM device with a desired code, such as an execution program code, are performed at the mask ROM device 200. Users who order the ROM device 200, usually determine the program code, thus the program code may be different from each other. The following steps of planarization for the first metal layer 217 and formation of the code areas 224 in the mask ROM device 200 can wait for an order-form from the users. Therefore, it can avoid the second dielectric layer 211 from becoming oxidized and form an oxide layer thereon while waiting for an order-form from the users. Furthermore, the semiconductor structure does not need to clean or remove the oxide layer, therefore the manufacturing time and manufacturing cost of the mask ROM device 200 are greatly reduced.

Due to the fact that one of the characteristic of the present invention is blanket etching back to the first glue layer 215, and then performing the step of defining the ROM code to the mask ROM device 200. Thus, the phenomenon of over etching will not happen in the second dielectric layer 211, that is to say; the profile with the bevels in the second dielectric layer 211 would not be occurred. Consequently, after performing the ion implantation process 223 in the mask ROM device 200, the code areas 224 in the silicon substrate 201 without the profile with bevels therein. For that reason, the boron ions can distribute uniformly in the code areas 224, which can improve the stability of the mask ROM device 200, and enhance the yield.

Still, another characteristic of the present invention directly defines the size of the second opening 221 on the photoresist layer 219 so that the critical dimension of second opening 221 is directly decided by the ability of development with a stepper. It means that the photoresist layer 219 would not be post exposed in order to broaden the code areas 224 because of the critical dimension bias of the second opening 221 which is negative. Accordingly, the photoresist layer, which is above the non-code areas will not be reduced, even vanished. Hence, it can maintain the accuracy of the mask ROM device 200, and have a good yield.

Figure 2H:
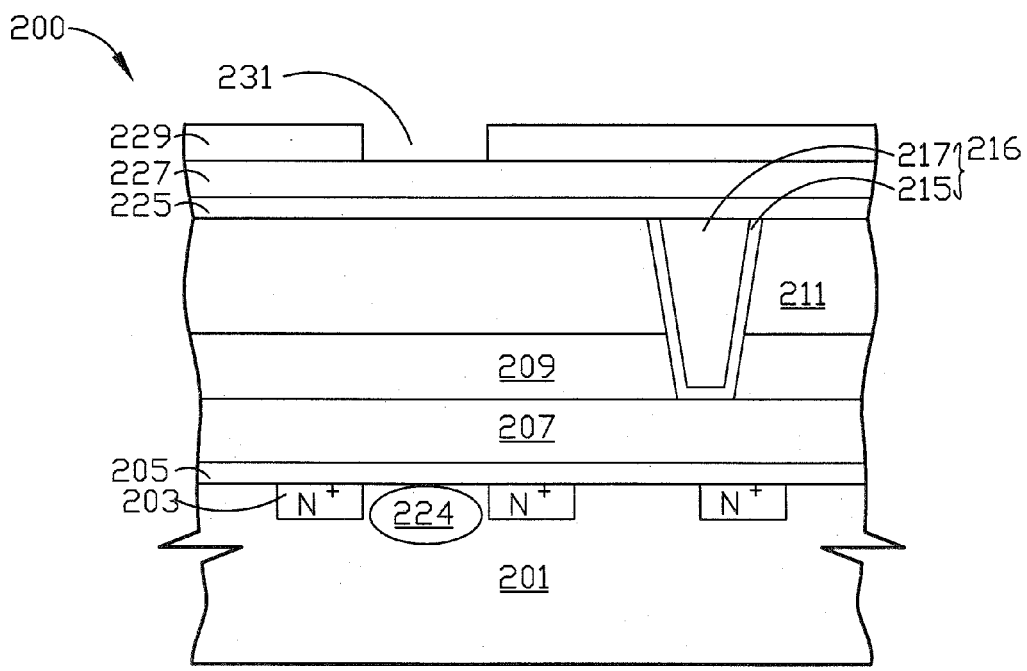
Figure 21:
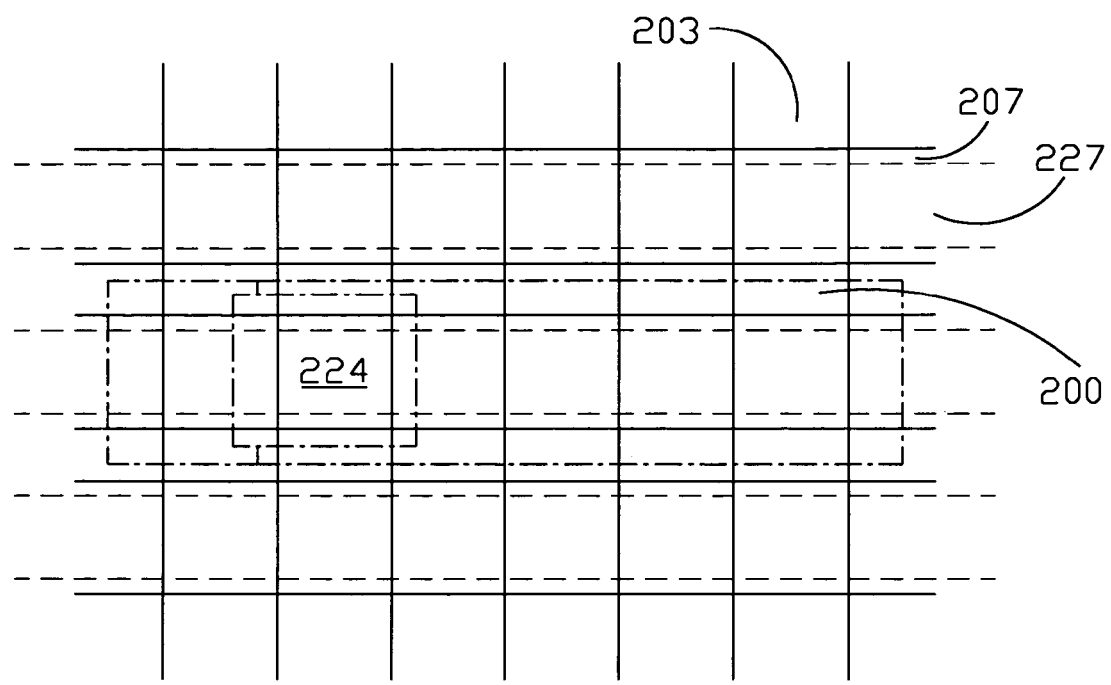

As soon as the ion implantation 223 is performed in the mask ROM device 200, referring to FIG. 2H, the photoresist layer 219 is removed. Then, a second glue layer 225, such as liner titanium/titanium nitride, with a thickness of about 100–500 microns, preferably is about 350 microns is formed on the second dielectric layer 211 and contact plug 216. The formation of the second glue layer 225, for instance utilizing sputtering, chemical vapor deposition or physical vapor deposition, that deposits a titanium layer on a surface of the second dielectric layer 211 and contact plug 216. Next, the titanium layer is nitrogenized by nitrogen gas or ammonium gas at a high temperature environment so as to convert the titanium layer into the titanium nitride layer on the surface of the second dielectric layer 211 and the contact plug 216. Following that, a second metal layer 227, such as aluminum, is formed on the surface of the second glue layer 225 that uses as transmission and connection in electricity within the mask ROM device 200. After that, a pad layer 229, such as silicon dioxide layer, is formed on the second metal layer 227 by chemical vapor deposition. Then, the third opening 231 is formed within the pad layer 229 by using photolithography process, wherein the third opening 231 is used as an electric connection with outside when packaging the mask ROM device 200. Finally, the present invention of the process for the mask ROM device is successively accomplished.

FIG. 2I shows a layout of mask ROM device 200 including the plurality of buried bit lines 203 in the semiconductor substrate, polysilicon word lines 207 orthogonally oriented with respect to the buried bit lines 203 and overlying the buried bit lines 203. The second metal layer 227 overlies on the buried bit lines 203, and the second metal layer 227 overlies on the polysilicon word lines 207. A mask ROM code areas 224 with rectangle shape are placed between two buried bit lines 203.

The preferred embodiments are only used to illustrate the present invention, not intended to limit the scope thereof. Many modifications of the preferred embodiments can be made without departing from the spirit of the present invention.

What is claimed is:

1. A method of manufacturing a mask read only memory, comprising sequential steps of:
   providing a semiconductor structure having a first opening therein;
   forming a first glue layer on a surface of said semiconductor structure extending into said first opening;
   forming a contact plug within said first opening in said semiconductor structure, said contact plug comprising a first glue layer lining said first opening and a first metal layer in said first opening;
   etching said first glue layer outside said contact plug in order to expose said surface of said semiconductor structure;
   forming a patterned photoresist layer on said semiconductor structure;
   forming a plurality of code areas in said semiconductor structure by using said patterned photoresist layer as a mask;
   removing said patterned photoresist layer; and
   forming a second glue layer on said semiconductor structure.

2. The method of claim 1, wherein said semiconductor structure comprises a plurality of buried bit lines therein.

3. The method of claim 2, wherein each of said plurality of code areas is formed between two of said buried bit lines.

4. The method of claim 1, wherein said first metal layer is deposited to cover said first glue layer.

5. The method of claim 4, wherein said contact plug is formed by planarizing said first metal layer.

6. The method of claim 1, wherein the material of said first metal layer is tungsten.

7. The method of claim 1, wherein said etching said first glue layer outside said contact plug in order to expose said surface of said semiconductor structure comprises a blanket etching back process.

8. The method of claim 1, wherein said forming said plurality of code areas in said semiconductor structure by using an ion implantation process.

9. The method of claim 1, wherein the material of said first glue layer is titanium/titanium nitride (Ti/TiN).

10. The method of claim 1, wherein said second glue layer comprises linear titanium/titanium nitride (Ti/TiN).

11. The method of claim 1, wherein said semiconductor structure comprises a dielectric layer on top thereof.

12. The method of claim 11, wherein the material of said dielectric layer comprises Borophosphosilicate Glass (BPSG).

13. The method of claim 11, wherein said dielectric layer comprises a first dielectric layer and a second dielectric on said first dielectric layer.

14. The method of claim 13, wherein said first opening is formed in said second dielectric of said semiconductor structure.

15. The method of claim 13, wherein said second dielectric is Borophosphosilicate Glass (BPSG).

16. The method of claim 1, wherein said patterned photoresist layer comprises a second opening corresponding to an area between two of said plurality of buried bit lines.

* * * * *